US009706145B2

(12) United States Patent
Ishiwata

(10) Patent No.: US 9,706,145 B2
(45) Date of Patent: Jul. 11, 2017

(54) SOLID-STATE IMAGING ELEMENT AND DRIVING METHOD THEREFOR, AND ELECTRONIC APPARATUS

(71) Applicant: SONY CORPORATION, Tokyo (JP)

(72) Inventor: Hiroaki Ishiwata, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/022,478

(22) PCT Filed: Sep. 12, 2014

(86) PCT No.: PCT/JP2014/074245
§ 371 (c)(1),
(2) Date: Mar. 16, 2016

(87) PCT Pub. No.: WO2015/045915
PCT Pub. Date: Apr. 2, 2015

(65) Prior Publication Data
US 2016/0234449 A1    Aug. 11, 2016

(30) Foreign Application Priority Data

Sep. 25, 2013    (JP) .................................. 2013-197872

(51) Int. Cl.
*H04N 5/232*    (2006.01)
*H04N 5/369*    (2011.01)
(Continued)

(52) U.S. Cl.
CPC ..... *H04N 5/3696* (2013.01); *H01L 27/14605* (2013.01); *H01L 27/14643* (2013.01);
(Continued)

(58) Field of Classification Search
CPC .... H04N 5/2254; H04N 5/3696; H04N 5/357; H04N 5/374; H04N 9/045;
(Continued)

(56) References Cited

U.S. PATENT DOCUMENTS 8,711,270 B2 *    4/2014    Onuki ...................... G02B 7/34
                                                                           348/345
8,754,976 B2 *    6/2014    Oikawa .................. G03B 13/36
                                                                           348/273
(Continued)

FOREIGN PATENT DOCUMENTS

JP    2004-165462    6/2004
JP    2012-023207    2/2012
(Continued)

OTHER PUBLICATIONS

Official Action (no English translation available) for Japanese Patent Application No. 2013-197872 mailed Sep. 27, 2016, 7 pages.
(Continued)

*Primary Examiner* — Kelly L Jerabek
(74) *Attorney, Agent, or Firm* — Sheridan Ross P.C.

(57) ABSTRACT

A solid-state imaging element, a driving method therefor, and an electronic apparatus, by which the characteristics of phase-difference pixels can be made constant irrespective of a chip position are provided.
In a pixel array section, a normal pixel including a photodiode (PD) that receives and photoelectrically converts incident light such that a color component signal is obtained, and a phase-difference pixel including a pair of a photodiode (PD1) and a photodiode (PD2) including light-receiving surfaces having a size depending on an image height such that a phase difference detection signal is obtained are arranged in a matrix form. The pair of the photodiode (PD1) and the photodiode (PD2) each include a first region serving as a charge accumulation main part and a second region that performs photoelectric conversion and contributes to charge transfer to the main part. The present technology is applicable to a CMOS image sensor, for example.

15 Claims, 10 Drawing Sheets

(51) Int. Cl.
*H01L 27/146* (2006.01)
*H04N 5/357* (2011.01)
*H04N 5/374* (2011.01)
*H04N 9/04* (2006.01)
*G03B 13/00* (2006.01)

(52) U.S. Cl.
CPC ............ *H04N 5/357* (2013.01); *H04N 5/374* (2013.01); *H04N 9/045* (2013.01)

(58) Field of Classification Search
CPC ........ H01L 27/14605; H01L 27/14643; G02B 7/34; G02B 7/343; G02B 7/346
USPC .................................. 348/294, 340, 345–349
See application file for complete search history.

(56) References Cited

U.S. PATENT DOCUMENTS

2012/0133821 A1* 5/2012 Takaiwa ............. H04N 5/23209 348/345
2012/0188425 A1* 7/2012 Kita ................... H04N 5/23212 348/294
2012/0212661 A1* 8/2012 Yamaguchi ............. G02B 7/38 348/346

FOREIGN PATENT DOCUMENTS

| | | |
|---|---|---|
| JP | 2012-084816 | 4/2012 |
| JP | 2012-128248 | 7/2012 |
| JP | 2012-165070 | 8/2012 |
| JP | 2012-182332 | 9/2012 |
| JP | 2013-037296 | 2/2013 |
| JP | 2013-080797 | 5/2013 |

OTHER PUBLICATIONS

International Search Report prepared by the Japanese Patent Office on Dec. 16, 2014, for International Application No. PCT/JP2014/074245.

* cited by examiner

RELATED ART

SOLID-STATE IMAGING ELEMENT AND DRIVING METHOD THEREFOR, AND ELECTRONIC APPARATUS

CROSS REFERENCE TO RELATED APPLICATIONS

This application is a national stage application under 35 U.S.C. 371 and claims the benefit of PCT Application No. PCT/JP2014/074245 having an international filing date of 12 Sep. 2014, which designated the United States, which PCT application claimed the benefit of Japanese Patent Application No. 2013-197872 filed 25 Sep. 2013, the disclosures of which are incorporated herein by reference in their entirety.

TECHNICAL FIELD

The present technology relates to a solid-state imaging element, a driving method therefor, and an electronic apparatus and more particularly to a solid-state imaging element, a driving method therefor, and an electronic apparatus, by which the characteristics of phase-difference pixels can be made constant irrespective of a chip position.

BACKGROUND ART

Conventionally, solid-state imaging elements such as a CMOS (Complementary Metal Oxide Semiconductor) image sensor have been widely used for imaging apparatuses. The imaging apparatus of this type has an AF (Autofocus) function of automating focusing. In recent years, requirements for AF accuracy and AF speed of a subject are increased more and more.

For example, in general, an AF module is additionally incorporated in a digital single-lens reflex camera. It involves an increase in casing size and mounting cost. Therefore, some of mirrorless interchangeable-lens cameras and compact digital still cameras realize the AF function by contrast AF without the additionally incorporated AF module. However, it is difficult to say that the AF speed is sufficient in current state.

Therefore, a digital camera that increases the AF speed by incorporating phase-difference pixels in a solid-state imaging element and realizing the AF function by image surface phase difference AF has been in practical use. In general, in the image surface phase difference method, a phase-difference pixel A and a phase-difference pixel B are paired for realizing the AF function. As a method of improving the AF accuracy, it is effective to increase the number of phase-difference pixels that are incorporated in the solid-state imaging element. Conventionally, it is realized by setting the phase-difference pixels A and B to be the same size as a normal pixel for imaging and, for example, changing a metal light shield.

Furthermore, Patent Document 1 discloses a technology in which phase-difference pixels A and B are placed in one pixel for increasing the number of pixels for AF, to thereby improve the AF accuracy. In addition, Patent Document 2 discloses a technology relating to back side illumination type phase-difference pixels.

Patent Document 1: Japanese Patent Application Laid-open No. 2012-165070

Patent Document 2: Japanese Patent Application Laid-open No. 2012-84816

SUMMARY OF INVENTION

Problem to be Solved by the Invention

Patent Document 1 discloses the image surface phase difference AF using a PD division system. This is a method in which phase-difference pixels A and B are placed in one pixel. In this method, a light-collecting spot S is set in a boundary between the phase-difference pixel A and the phase-difference pixel B.

For example, in a lens interchangeable digital camera, the light-collecting spot position depends on the F-value of the interchangeable lens. Even if the lenses are not interchanged, the F-value is changed when wide-angle imaging and telephoto and zooming are performed, and the light-collecting spot position is correspondingly changed. In general, regarding the image surface phase difference AF using the PD division system, the light-collecting spot S is not changed in the center portion of an angle of view (center portion of chip) in any lens. Therefore, if the phase-difference pixel A and the phase-difference pixel B are set to have the same size, it is possible to set the light-collecting spot S in the boundary between the phase-difference pixel A and the phase-difference pixel B. FIG. 1 shows an example in which the light-collecting spot S is set in the center of a pixel.

On the other hand, in a peripheral portion of the angle of view (peripheral portion of chip), the light-collecting spot S can be set in the center of the pixel in some lenses if a microlens is subjected to pupil correction. However, if lenses having different F-values are used, there is a possibility that the light-collecting spot S may be deviated from the center of the pixel. In this case, in order to set the light-collecting spot S in the boundary between the phase-difference pixel A and the phase-difference pixel B, it is necessary to set the light-receiving surfaces of the phase-difference pixel A and the phase-difference pixel B to have a different size. The light-collecting spot position is changed depending on an image height, and hence it is necessary to change, depending on the arrangement position of the pixels in the solid-state imaging element, the size ratio between the phase-difference pixels A and B in that pixel. FIG. 2 shows an example in which the size of the phase-difference pixel A is set to be smaller than the size of the phase-difference pixel B. By changing the ratio between the phase-difference pixels A and B in this manner, it is possible to set the light-collecting spot S in the boundary between the phase-difference pixel A and the phase-difference pixel B.

However, as shown in FIG. 2, when the size ratio between the phase-difference pixels A and B is changed, the charge accumulation region of the phase-difference pixel A becomes smaller than the charge accumulation region of the phase-difference pixel B. Thus, the saturation signal amount of the phase-difference pixel A decreases. Furthermore, the size of the phase-difference pixels A and B is variously changed depending on the position of the light-collecting spot S. Therefore, it is not easy to completely transfer charges of all the phase-difference pixels A and B.

Note that Patent Document 2 discloses the technology relating to the back side illumination type phase-difference pixels and it does not adopt the PD division system.

The present technology has been made in view of such situations to make the characteristics of the phase-difference pixels constant irrespective of a chip position such as the center portion of an angle of view and a peripheral portion of the angle of view.

Means for Solving the Problem

A solid-state imaging element according to an aspect of the present technology includes: a pixel array section in which a first pixel including a photoelectric conversion unit that receives and photoelectrically converts incident light such that a color component signal is obtained, and a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including a first region serving as a charge accumulation main part, and a second region that performs photoelectric conversion and contributes to charge transfer to the main part.

In the pair of the first photoelectric conversion unit and the second photoelectric conversion unit, the second regions on a light incident side have a size depending on pupil correction and the first regions on an opposite side of the light incident side have the same size.

Impurity concentration in the first region is higher than impurity concentration in the second region.

The second region is larger than the first region.

It further includes: a first transfer transistor that transfers charges accumulated in the first photoelectric conversion unit, and a second transfer transistor that transfers charges accumulated in the second photoelectric conversion unit, in which in the pair of the first photoelectric conversion unit and the second photoelectric conversion unit, impurity concentration in a region near the first transfer transistor and a region near the second transfer transistor is higher than impurity concentration in other regions.

The first transfer transistor is disposed near a position closest to a center of the light-receiving surface of the first photoelectric conversion unit, and the second transfer transistor is disposed near a position closest to a center of the light-receiving surface of the second photoelectric conversion unit.

It further includes: a first floating diffusion region held for reading out a charge transferred from the first photoelectric conversion unit by the first transfer transistor, as a signal; and a second floating diffusion region held for reading out a charge transferred from the second photoelectric conversion unit by the second transfer transistor, as a signal.

Exposure and transfer in the first photoelectric conversion unit and the second photoelectric conversion unit are performed at the same time.

The pair of the first photoelectric conversion unit and the second photoelectric conversion unit includes a separation section therebetween that is continuously changed.

The pair of the first photoelectric conversion unit and the second photoelectric conversion unit is separated by metal, an oxide film, or impurities.

In the solid-state imaging element according to the aspect of the present technology, the first pixel including the photoelectric conversion unit that receives and photoelectrically converts incident light such that the color component signal is obtained, and the second pixel including the pair of a the first photoelectric conversion unit and the second photoelectric conversion unit including the light-receiving surfaces having a size depending on the image height such that the phase difference detection signal is obtained are arranged in a matrix form in the pixel array section. The pair of the first photoelectric conversion unit and the second photoelectric conversion unit each include the first region serving as the charge accumulation main part, and the second region that performs photoelectric conversion and contributes to charge transfer to the main part.

A driving method for a solid-state imaging element, according to an aspect of the present technology, the solid-state imaging element including a pixel array section in which a first pixel including a photoelectric conversion unit that receives and photoelectrically converts incident light such that a color component signal is obtained, and a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including a first region serving as a charge accumulation main part, and a second region that performs photoelectric conversion and contributes to charge transfer to the main part, the method including: a step of separately driving, by the pixel driving unit, the pair of the first photoelectric conversion unit and the second photoelectric conversion unit to perform exposure and transfer in the first photoelectric conversion unit and the second photoelectric conversion unit at the same time.

In the driving method according to the aspect of the present technology, the pair of the first photoelectric conversion unit and the second photoelectric conversion unit including the light-receiving surfaces having a size depending on the image height is separately driven to perform exposure and transfer in the first photoelectric conversion unit and the second photoelectric conversion unit at the same time.

An electronic apparatus according to an aspect of the present technology includes: a solid-state imaging element, including a pixel array section in which a first pixel including a photoelectric conversion unit that receives and photoelectrically converts incident light such that a color component signal is obtained, and a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including a first region serving as a charge accumulation main part, and a second region that performs photoelectric conversion and contributes to charge transfer to the main part; and a control unit that controls image surface phase difference AF (Autofocus) using the phase difference detection signal output from the solid-state imaging element.

In the electronic apparatus according to the aspect of the present technology, the image surface phase difference AF is controlled using the phase difference detection signal output from the solid-state imaging element.

Effects of the Invention

According to an aspect of the present technology, it is possible to make the characteristics of the phase-difference pixels constant irrespective of a chip position.

MODE(S) FOR CARRYING OUT THE INVENTION

Hereinafter, embodiments according to the present technology will be described with reference to the drawings.

<Configuration Example of Solid-State Imaging Element>

Figure 1:
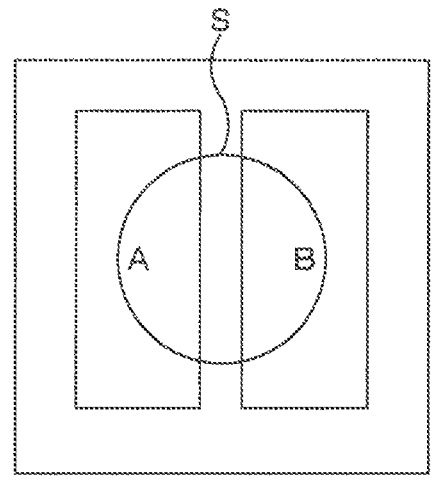
FIG. 1 A diagram for describing a PD division system.
Figure 2:
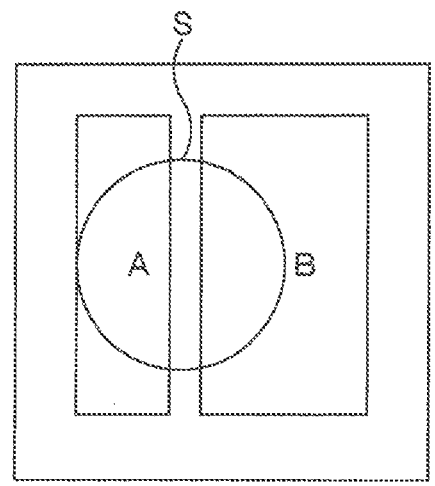
FIG. 2 A diagram for describing the PD division system.
Figure 3:
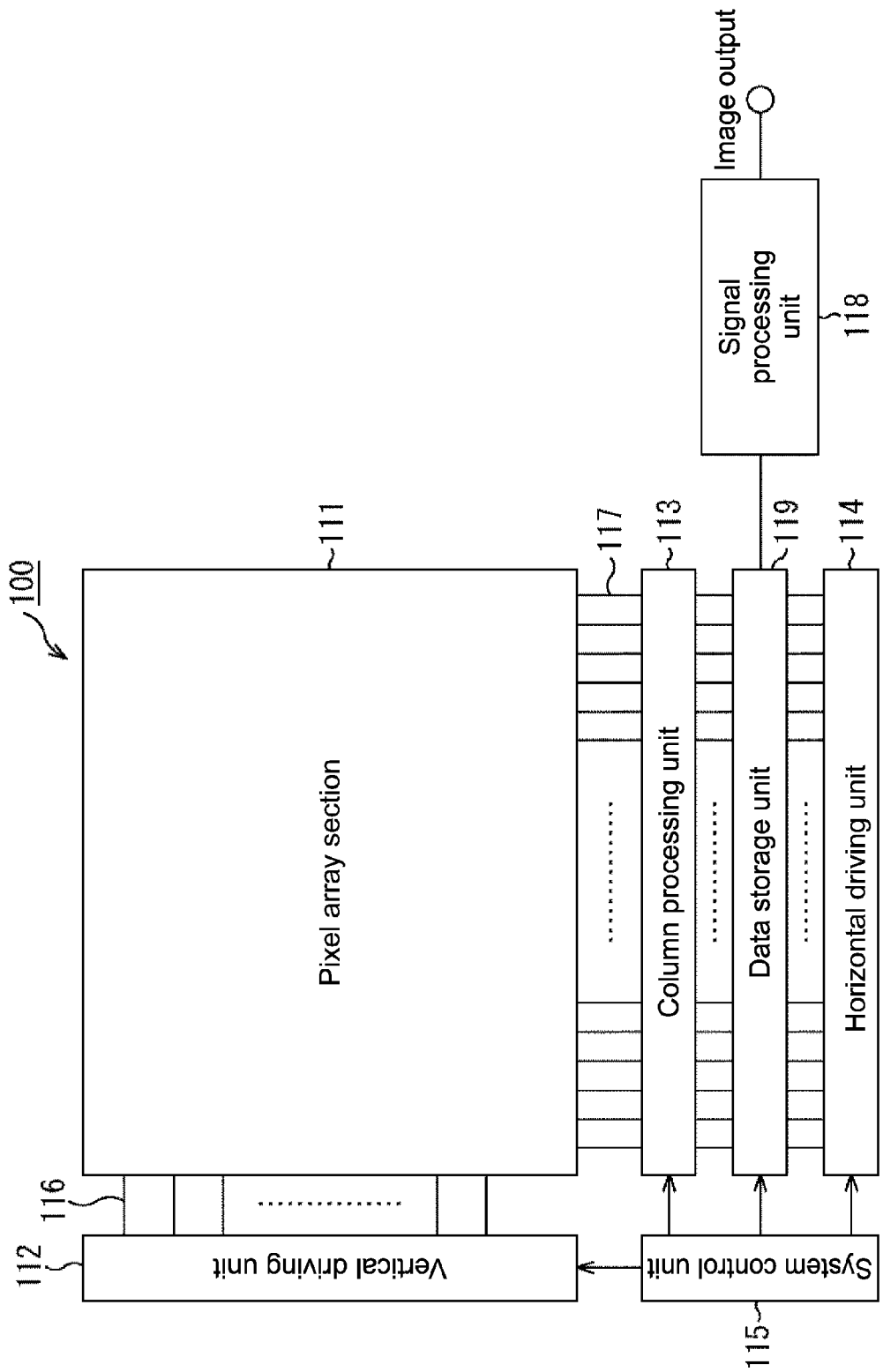
FIG. 3 A block diagram showing a configuration of an embodiment of a solid-state imaging element to which the present technology is applied.

FIG. 3 is a block diagram showing a configuration of an embodiment of a solid-state imaging element to which the present technology is applied.

A CMOS image sensor 100 is an example of the solid-state imaging element. As shown in FIG. 3, the CMOS image sensor 100 is configured to include a pixel array section 111 and a peripheral circuit section. The peripheral circuit section is constituted of a vertical driving unit 112, a column processing unit 113, a horizontal driving unit 114, and a system control unit 115.

The CMOS image sensor 100 further includes a signal processing unit 118 and a data storage unit 119. The signal processing unit 118 and the data storage unit 119 may be placed on the same semiconductor substrate as the CMOS image sensor 100 or may be an external signal processing unit provided in a semiconductor substrate other than the CMOS image sensor 100, for example, a DSP (Digital Signal Processor) or processing by software.

In the pixel array section 111, unit pixels (hereinafter, also simply referred to as "pixels") are arranged in a two-dimensional matrix form. Note that a specific configuration of the unit pixel will be described later. In the pixel array section 111, pixel driving lines 116 are further formed in left and right directions of the figure for each row with respect to the matrix-form pixel arrangement and vertical signal lines 117 are formed in upper and lower directions of the figure for each column. One ends of the pixel driving lines 116 are connected to output ends corresponding to the rows of the vertical driving unit 112.

The vertical driving unit 112 is a pixel driving unit that is constituted of a shift resistor, an address decoder, or the like and drives the pixels of the pixel array section 111, for example, at the same time or for each row. The signals output from the unit pixels in the pixel row that is selectively scanned by the vertical driving unit 112 are supplied to the column processing unit 113 through the respective vertical signal lines 117. For each of the pixel columns of the pixel array section 111, the column processing unit 113 performs predetermined signal processing on signals output from the pixels in the selected row through the vertical signal lines 117 and temporarily retains the pixel signals after signal processing.

Specifically, the column processing unit 113 performs at least noise elimination, for example, CDS (Correlated Double Sampling) as signal processing. Due to the CDS by the column processing unit 113, fixed-pattern noise specific to the pixel, for example, reset noise or variations in threshold of an amplification transistor is eliminated. The column processing unit 113 may be set to have, for example, an A/D (Analog/Digital) conversion function for outputting a signal level as a digital signal other than the noise elimination processing.

The horizontal driving unit 114 is constituted of the shift resistor, the address decoder, and the like and sequentially selects unit circuits corresponding to the pixel columns of the column processing unit 113. By selective scanning by the horizontal driving unit 114, the pixel signals subjected to signal processing by the column processing unit 113 are sequentially output.

The system control unit 115 includes a timing generator that generates various timing signals and performs driving control on the vertical driving unit 112, the column processing unit 113, the horizontal driving unit 114, the data storage unit 119, and the like based on the various timing signals generated by the timing generator.

The signal processing unit 118 has at least an addition processing function and performs various types of signal processing such as addition processing on the pixel signals output from the column processing unit 113. For signal processing in the signal processing unit 118, the data storage unit 119 temporarily stores data necessary for the processing.

Note that the CMOS image sensor 100 is a back side illumination type image sensor that reads out, from the front side of the semiconductor substrate, a signal depending on charges generated in the photoelectric conversion unit due to light entering the photoelectric conversion unit in the semiconductor substrate from the back side of the semiconductor substrate.

<Structure of Unit Pixel>

Next, with reference to FIGS. 4 to 6, a specific structure of unit pixels arranged in a matrix form in the pixel array section 111 of FIG. 3 will be described. The unit pixels include normal pixels 120 for outputting color component signals for forming an image signal indicating an image of the subject as pixel signals and a phase-difference pixel 121 for outputting a phase difference detection signal used for the image surface phase difference AF as a pixel signal.

Figure 4:
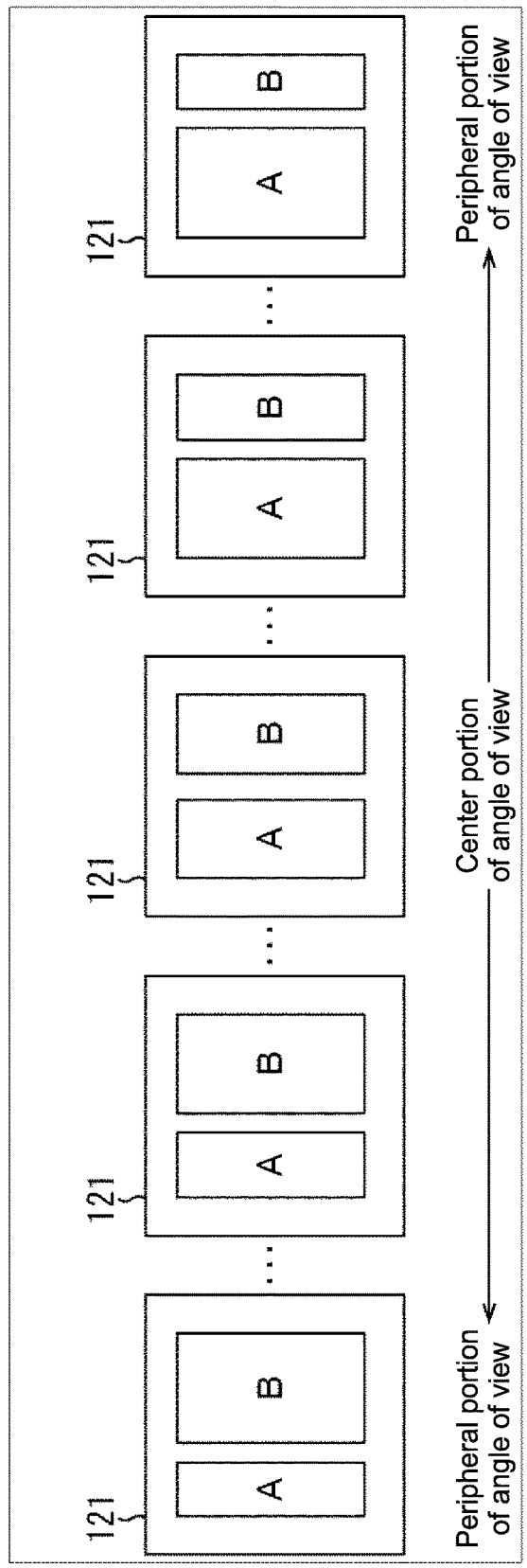
FIG. 4 A diagram showing an arrangement example of phase-difference pixels in a pixel array section.

FIG. 4 shows phase-difference pixels 121 arranged in a row out of the unit pixels arranged in the pixel array section 111. As shown in FIG. 4, the phase-difference pixels 121 have the same size light-receiving surfaces in the center portion of an angle of view (center portion of chip) that is on an axis. Meanwhile, in peripheral portions of the angle of view (peripheral portion of chip) outside the axis, they have different size light-receiving surfaces depending on the image height. For example, in the case of the example of FIG. 4, the phase-difference pixel 121 located on the left side in the figure includes a smaller light-receiving surface of the phase-difference pixel 121A. Meanwhile, the phase-difference pixel 121 located on the right side of the figure includes a smaller light-receiving surface of a phase-difference pixel 121B.

Figure 5:
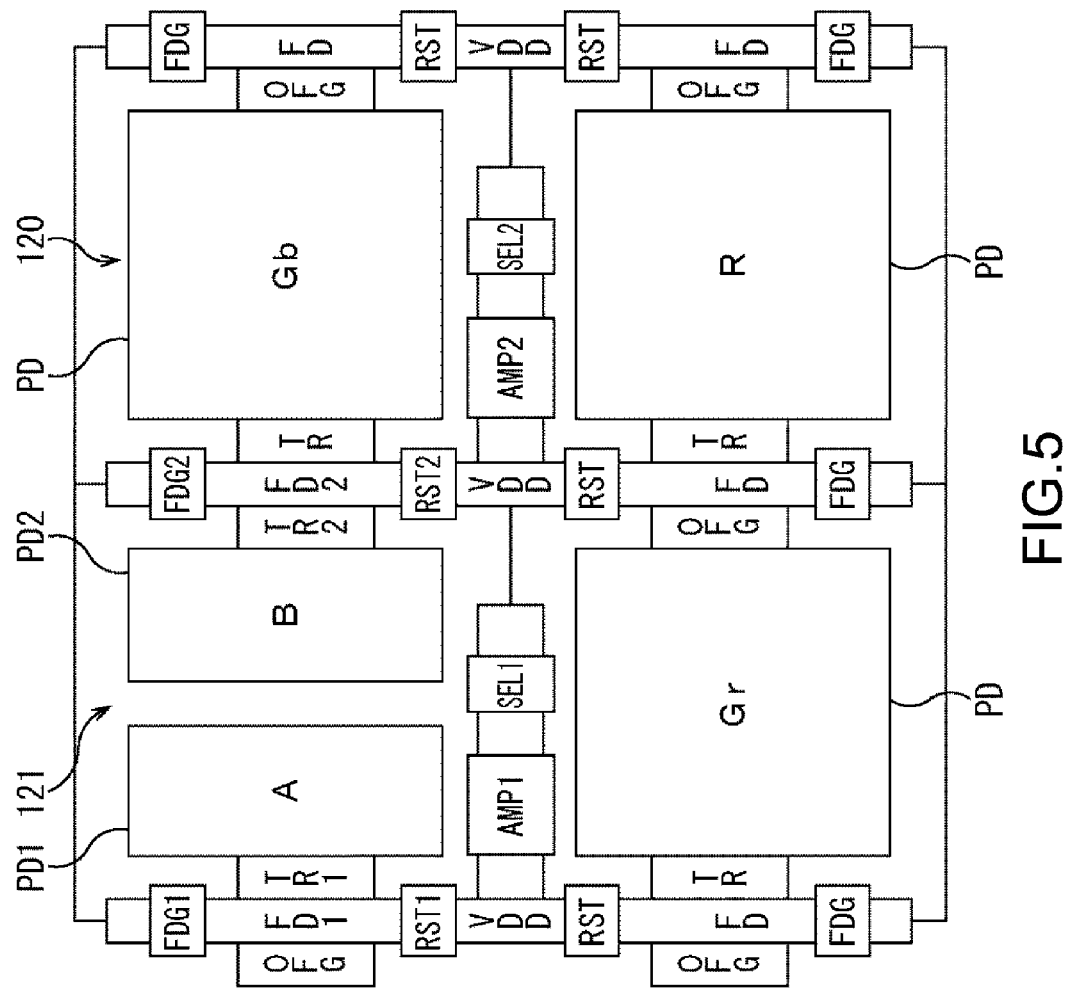
FIG. 5 A plane view showing a configuration of a unit pixel in the center portion of an angle of view.
Figure 6:
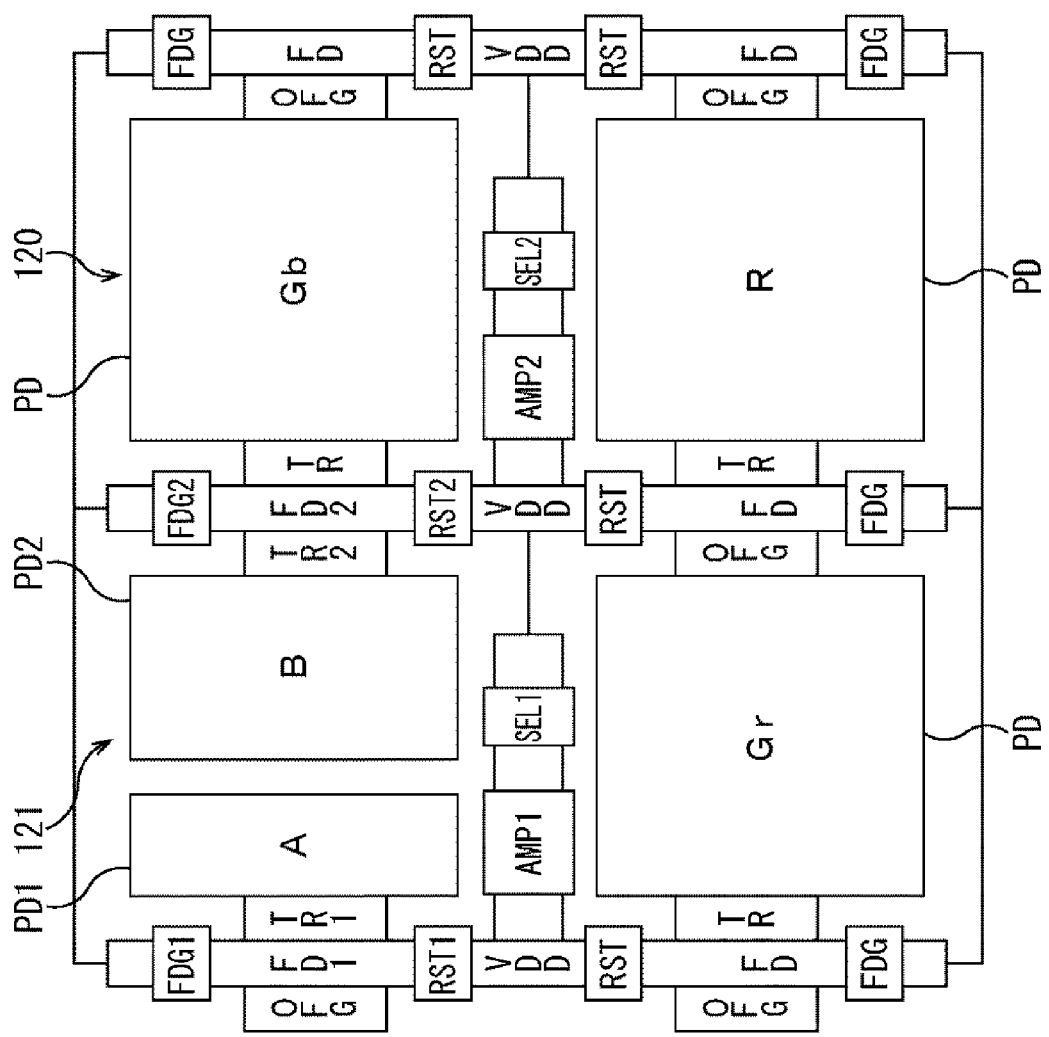
FIG. 6 A plane view showing a configuration of a unit pixel in a peripheral portion of the angle of view.

FIGS. 5 and 6 are plane views each showing a configuration of a unit pixel. FIG. 5 shows the configuration of the unit pixel in the center portion of the angle of view. FIG. 6 shows the configuration of the unit pixel in the peripheral portion of the angle of view.

The normal pixel 120 is constituted of a photodiode (PD) serving as the photoelectric conversion unit and a plurality of pixel transistors. The photodiode (PD) includes a region for receiving and photoelectrically converting incident light and accumulating signal charges generated by the photoelectric conversion. For example, the photodiode (PD) is a buried type photodiode that is formed by forming, with respect to a P-type well layer formed on an N-type substrate, a P-type layer on the front side of the substrate and burying an N-type buried layer.

Furthermore, a plurality of pixel transistors include four transistors of a transfer transistor (TR), a reset transistor (RST), an amplification reset transistor (AMP), and a selection transistor (SEL). The transfer transistor (TR) is a transistor for reading out charges accumulated in the photodiode (PD) to a floating diffusion region (FD) region. The reset transistor (RST) is a transistor for setting the potential of the floating diffusion region (FD) to a specific value. The amplification reset transistor (AMP) is a transistor for electrically amplifying signal charges read out by the floating diffusion region (FD). The selection transistor (SEL) is a transistor for selecting one pixel row and reading out pixel signals to the vertical signal lines 117.

A capacitance-switching transistor (FDG) is a transistor for switching conversion efficiency in the floating diffusion region (FD). Furthermore, an overflow control transistor (OFG) is a transistor for realizing overflow control.

As described above, the normal pixels 120 includes the photodiode (PD) and the plurality of pixel transistors and outputs color component signals of any one of red (R), green (G), and blue (B), for example as pixel signals. Although a Gb-pixel, a Gr-pixel, and an R-pixel are shown as the normal pixels 120 in FIG. 5, a B-pixel also has the same configuration as the pixels corresponding to the other color components.

The phase-difference pixel 121 adopts a PD division system. Instead of one photodiode (PD) serving as the photoelectric conversion unit, the phase-difference pixel 121 includes two photodiodes (PD1, PD2) as obtained by halving it. Note that, also in the following description, out of the pair of phase-difference pixels in the phase-difference pixel 121, one pixel constituted of a photodiode (PD1) and a plurality of pixel transistors will be referred to as the phase-difference pixel 121A and the other pixel constituted of a photodiode (PD2) and a plurality of pixel transistors will be referred to as the phase-difference pixel 121B. That is, regarding the phase-difference pixel 121, by forming the two photodiodes (PD1, PD2) in this pixel, the phase-difference pixel 121A and the phase-difference pixel 121B are configured as a pair.

In the phase-difference pixel 121A, the photodiode (PD1) has a region for receiving and photoelectrically converting incident light and accumulating signal charges generated by the photoelectric conversion. For example, the photodiode (PD1) is formed as the buried type photodiode as in the photodiode (PD) of the normal pixels 120. Furthermore, the plurality of pixel transistors include four transistors of the transfer transistor (TR1), the reset transistor (RST1), the amplification reset transistor (AMP1), and the selection transistor (SEL1) as in the normal pixels 120.

Furthermore, in the phase-difference pixel 121B, the photodiode (PD2) has a region for receiving and photoelectrically converting incident light and accumulating signals charges generated by the photoelectric conversion. For example, the photodiode (PD2) is formed as the buried type photodiode as in the photodiode (PD) of the normal pixels 120. Furthermore, the plurality of pixel transistors include, as in the normal pixels 120, four transistors of the transfer transistor (TR2), the reset transistor (RST2), the amplification reset transistor (AMP2), and the selection transistor (SEL2).

That is, in the phase-difference pixel 121, the pixel transistors (TR1, RST1, AMP1, SEL1) for the photodiode (PD1) and the pixel transistors (TR, RST2, AMP2, SEL2) for the photodiode (PD2) are separately provided, and hence exposure and transfer in the photodiode (PD1) and the photodiode (PD2) can be performed at the same time.

Here, FIG. 5 shows a configuration of the unit pixel in the center portion of the angle of view. Therefore, the photodiode (PD1) in the phase-difference pixel 121A and the photodiode (PD2) in the phase-difference pixel 121B have the same size light-receiving surfaces. On the other hand, as shown in FIG. 6, although the phase-difference pixel 121 in the peripheral portion of the angle of view is configured such that the phase-difference pixel 121A and the phase-difference pixel 121B are paired as in the phase-difference pixel 121 in the center portion of the angle of view, the size of the light-receiving surface is changed depending on the image height. Specifically, the size of the light-receiving surface of the photodiode (PD1) in the phase-difference pixel 121A is smaller than the size of the light-receiving surface of the photodiode (PD2) in the phase-difference pixel 121B.

In this manner, by changing the size of the light-receiving surface depending on the image height, the light-collecting spot S is set in the boundary between the phase-difference pixel 121A and the phase-difference pixel 121B. However, along with it, the charge accumulation region of the phase-difference pixel 121A becomes smaller than the charge accumulation region of the phase-difference pixel 121B with the result that the saturation signal amount of the phase-difference pixel 121A is lowered as described above. Furthermore, as described above, the sizes of the phase-difference pixel 121A and the phase-difference pixel 121B are variously changed depending on the position of the light-collecting spot S. Therefore, it is not easy to completely transfer the charges of all the phase-difference pixels 121A and 121B.

In view of this, hereinafter, a first pupil correction method and a second pupil correction method for suppressing a reduction in the saturation signal amount of the phase-difference pixels 121A and 121B and completely transferring the charges of the phase-difference pixels 121A and 121B in the case where the size of the light-receiving surface is changed depending on the image height will be described.

First Embodiment

Figure 7:
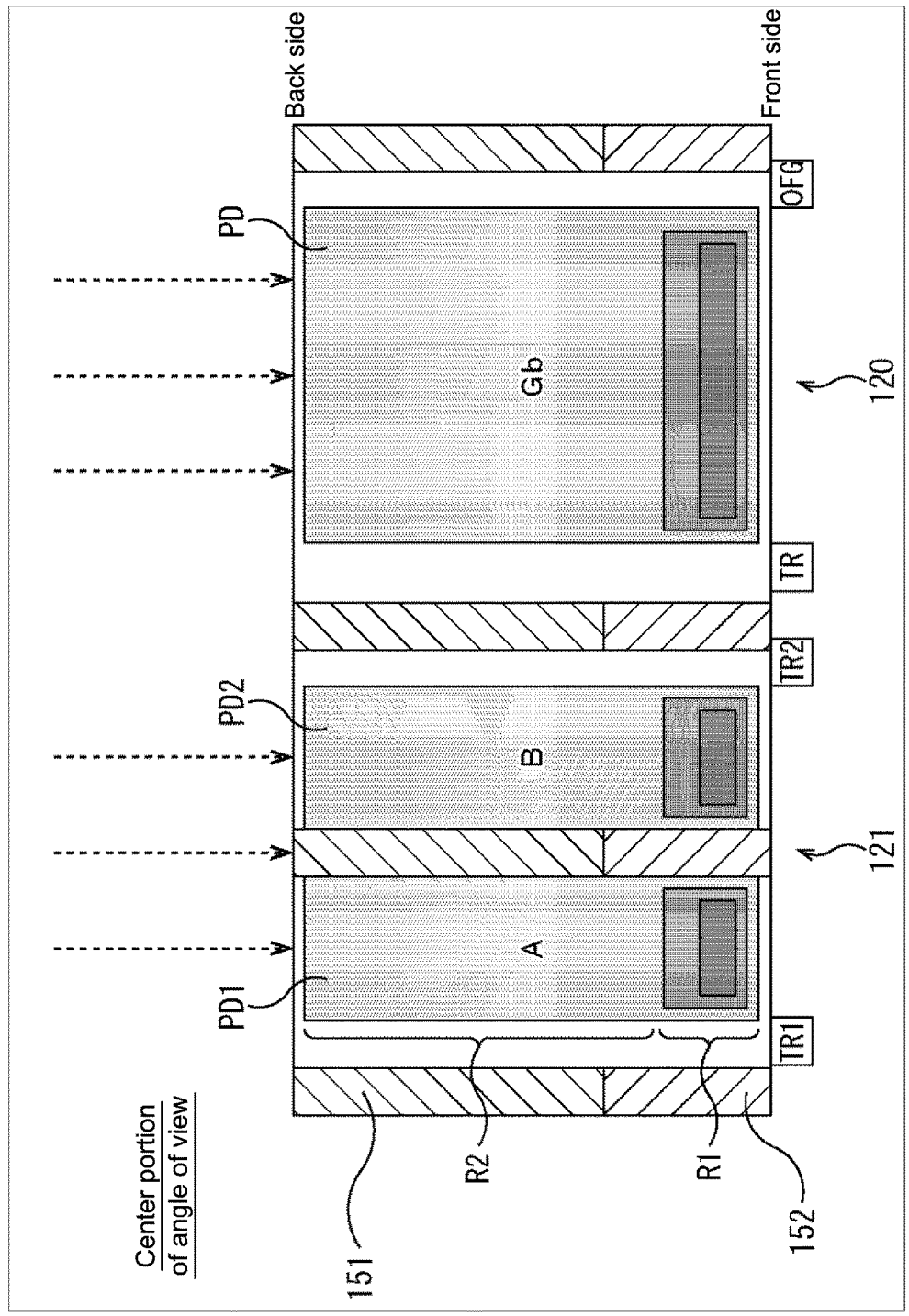
FIG. 7 A sectional view showing a configuration of a unit pixel in the center portion of an angle of view in the case where a first pupil correction method is adopted.
Figure 8:
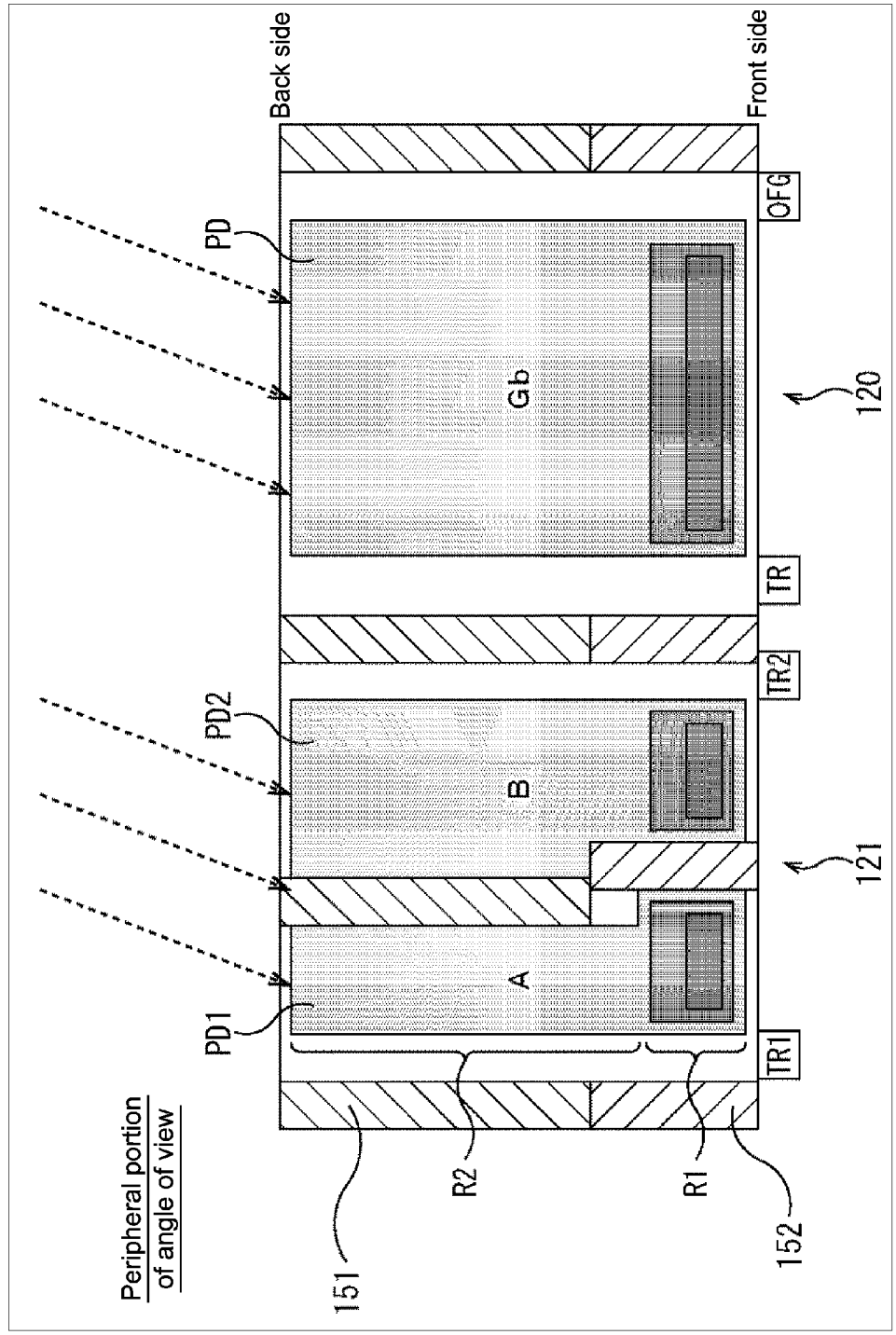
FIG. 8 A sectional view showing a configuration of a unit pixel in a peripheral portion of the angle of view in the case where the first pupil correction method is adopted.

First, with reference to FIGS. 7 and 8, the first pupil correction method as the first embodiment will be described. FIG. 7 shows a sectional view of the normal pixel 120 (Gb-pixel) and the phase-difference pixel 121 in the center portion of the angle of view shown in FIG. 5. FIG. 8 shows a sectional view of the normal pixel 120 (Gb-pixel) and the phase-difference pixel 121 in the peripheral portion of the angle of view shown in FIG. 6.

As shown in FIG. 7, in the first pupil correction method, the photodiode (PD1) in the phase-difference pixel 121A is formed of a first region R1 serving as a charge accumulation main part and a second region R2 that performs photoelectric conversion and contributes to charge transfer to the main part. Furthermore, the photodiode (PD2) in the phase-difference pixel 121B is also formed of the first region R1 and the second region R2. Note that, in each of the photodiodes (PD1, PD2), the impurity concentration is represented by gradation and the impurity concentration in the first region R1 is higher than the impurity concentration in the second region R2. Furthermore, occupying rate of the second region R2 in the whole region is higher than that of the first region R1.

Furthermore, the phase-difference pixel 121 changes the size of the light-receiving surface depending on the image height. Therefore, it is unnecessary to change the width of the second region R2 on light incident side (back side) in the center portion of the angle of view while it is necessary to reduce the width of the second region R2 in the peripheral portion of the angle of view. That is, as shown in FIG. 8, in the peripheral portion of the angle of view, the width of the second region R2 of the photodiode (PD1) in the phase-difference pixel 121A is formed to be narrower than the width of the second region R2 of the photodiode (PD2) in the phase-difference pixel 121B. On the other hand, regarding light incident side and opposite side (front side), the width of the first region R1 of the photodiode (PD1) and the width of the first region R1 of the photodiode (PD2) are formed to be equal in the peripheral portion of the angle of view as in the center portion of the angle of view.

That is, element separation portions serving to separate the elements of the pixels are separately formed as an element separation portion 151 on the back side and an element separation portion 152 on the front side. The element separation portion 151 changes the width of the second region R2 between the center portion of the angle of view and the peripheral portion of the angle of view. On the other hand, the element separation portion 152 sets the width of the first region R1 to be equal between the center portion of the angle of view and the peripheral portion of the angle of view. With this, in each phase-difference pixel 121, even if the size of the light-receiving surface is continuously changed depending on the image height and the size of the second region R2 on the back side is changed, the size of the first region R1 on the front side is not changed. As a result, the size of the first region R1 having a high impurity concentration is fixed. Therefore, in the peripheral portion of the angle of view, in comparison with the center portion of the angle of view, a large difference does not occur between the saturation signal amount and the transfer ease. Thus, it is possible to make the characteristics of the phase-difference pixels 121 arranged in the pixel array section 111 constant.

Note that the element separation portion 151 and the element separation portion 152 can be formed of, for example, metal, an oxide film, or impurities.

As described above, in the first pupil correction method, regarding the phase-difference pixel 121A and the phase-difference pixel 121B, the first regions R1 and the second regions R2 have the same configurations in the center portion of the angle of view of FIG. 7 and the second regions R2 have different configurations while the first regions R1 have the same configurations in the peripheral portion of the angle of view of FIG. 8. In this manner, a large difference is prevented from occurring between the saturation signal amount and the transfer ease, and the characteristics of the phase-difference pixels 121 arranged in the pixel array section 111 are made constant.

Second Embodiment

Figure 9:
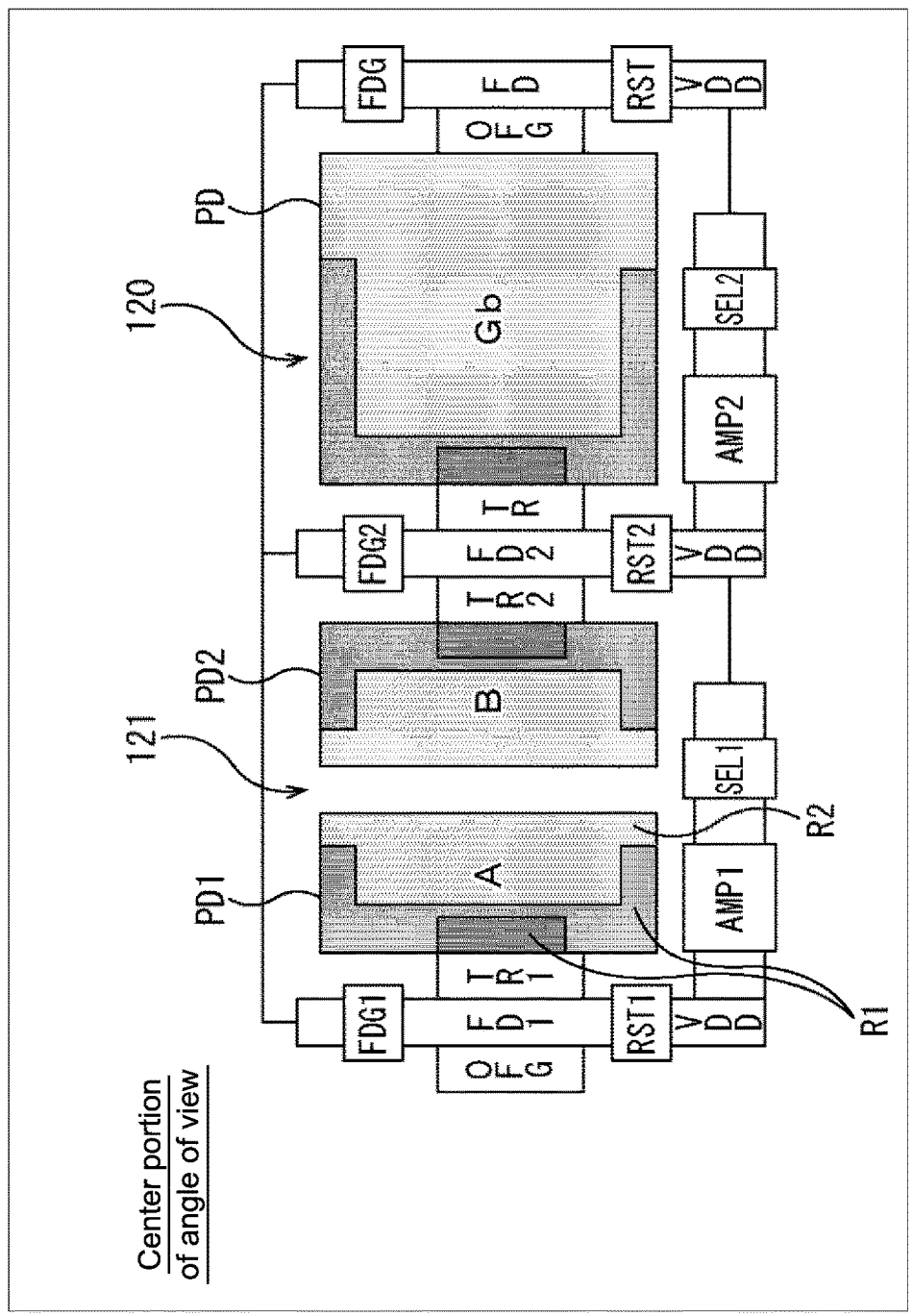
FIG. 9 A plane view showing a configuration of a unit pixel in the center portion of the angle of view in the case where a second pupil correction method is adopted.
Figure 10:
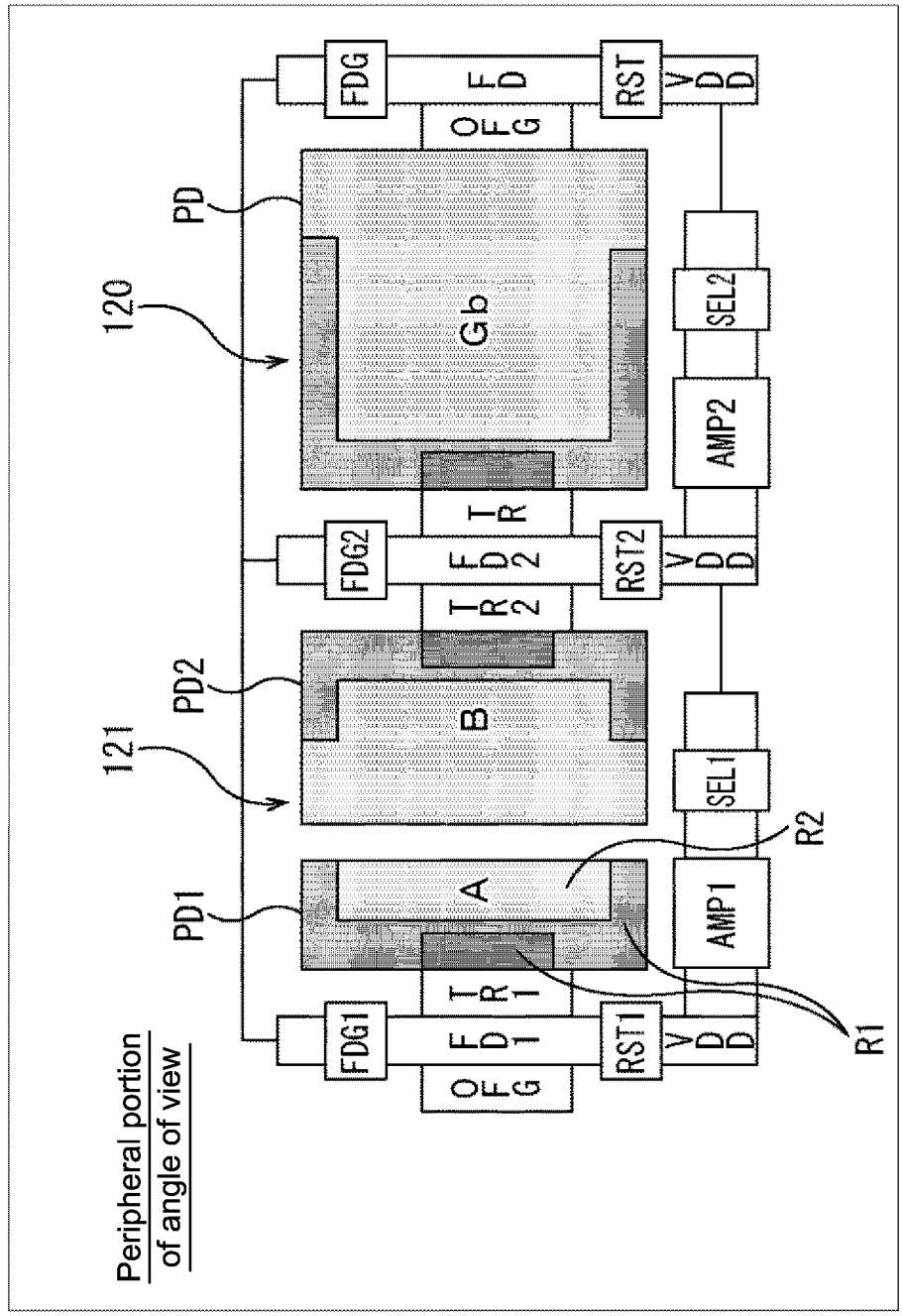
FIG. 10 A plane view showing a configuration of a unit pixel in the peripheral portion of the angle of view in the case where the second pupil correction method is adopted.

Next, with reference to FIGS. 9 and 10, the second pupil correction method as a second embodiment will be described. FIG. 9 shows a plane view of the normal pixel 120 (Gb-pixel) and the phase-difference pixel 121 in the center portion of the angle of view shown in FIG. 5. FIG. 10 shows a plane view of the normal pixel 120 (Gb-pixel) and the phase-difference pixel 121 in the peripheral portion of the angle of view shown in FIG. 6.

As shown in FIG. 9, in the second pupil correction method, as in the first pupil correction method, the photodiode (PD1) in the phase-difference pixel 121A is formed of a first region R1 serving as a charge accumulation main part and a second region R2 that performs photoelectric conversion and contributes to charge transfer to the main part. Furthermore, the photodiode (PD2) in the phase-difference pixel 121B is also formed of the first region R1 and the second region R2. Note that, in FIGS. 9 and 10, the impurity concentration in the photodiodes (PD1, PD2) is represented by gradation as in FIGS. 7 and 8.

Furthermore, in the phase-difference pixel 121A, a transfer transistor (TR1) is disposed in parallel to a direction in which the phase-difference pixel 121A and the phase-difference pixel 121B are divided, and near the position closest to the center of the light-receiving surface of the photodiode (PD1). With this, the impurity concentration in a region near the transfer transistor (TR1) becomes higher than the impurity concentration in other regions. Similarly, in the phase-difference pixel 121B, a transfer transistor (TR2) is disposed in parallel to a direction in which the phase-difference pixel 121A and the phase-difference pixel 121B are divided, and near the position closest to the center of the light-receiving surface of the photodiode (PD2). With this, the impurity concentration in a region near the transfer transistor (TR2) becomes higher than the impurity concentration in other regions.

Furthermore, the phase-difference pixel 121 changes the size of the light-receiving surface depending on the image height. Therefore, it is unnecessary to change the size of the light-receiving surface in the center portion of the angle of view while it is necessary to reduce the size of the light-receiving surface in the peripheral portion of the angle of view. That is, as shown in FIG. 10, in the peripheral portion of the angle of view, the size of the light-receiving surface in the phase-difference pixel 121A is formed to be smaller than the size of the light-receiving surface in the phase-difference pixel 121B. However, in the peripheral portion of the angle of view, transfer transistors (TR1, TR2) are arranged in the peripheral portion of the angle of view as in the center portion of the angle of view, and hence the impurity concentration in regions near the transfer transistors (TR1, TR2) is higher than the impurity concentration in other regions.

That is, in each phase-difference pixel 121, even if the size of the light-receiving surface is continuously changed depending on the image height and the size of the light-receiving surface in, for example, the phase-difference pixel 121A becomes small, the first region R1 having a high impurity concentration is constantly formed in a region near the transfer transistor (TR1). As a result, the first region R1 having a high impurity concentration is not influenced by the change in size. Therefore, in the peripheral portion of the angle of view, in comparison with the center portion of the angle of view, a large difference does not occur between the saturation signal amount and the transfer ease. Thus, it is possible to make the characteristics of the phase-difference pixels 121 arranged in the pixel array section 111 constant.

As described above, in the second pupil correction method, although the size of the light-receiving surface is changed in the center portion of the angle of view of FIG.

9 and the peripheral portion of the angle of view of FIG. 10, the structures near the transfer transistors (TR1, TR2) have the same configurations and the impurity concentration in the regions near the transfer transistors (TR1, TR2) is higher than that in the other regions. In this manner, a large difference is prevented from occurring between the saturation signal amount and the transfer ease, and the characteristics of the phase-difference pixels 121 arranged in the pixel array section 111 are made constant.

As described above, according to the present technology, in the phase-difference pixels 121 arranged in the pixel array section 111, when continuously changing the size of the light-receiving surface depending on the image height, the first region R1 having a high impurity concentration is not influenced by the change. Therefore, in the peripheral portion of the angle of view, in comparison with the center portion of the angle of view, a large difference does not occur between the saturation signal amount and the transfer ease. Thus, it is possible to make the characteristics of the phase-difference pixels 121 constant. That is, in the phase-difference pixels 121, the main parts of the charge accumulation have the same structure, and hence it becomes possible to perform pupil correction and suppress a reduction of the saturation signal amount at the same time and to similarly perform charge transfer.

Furthermore, regarding the phase-difference pixel 121, the phase-difference pixel 121A and the phase-difference pixel 121B are installed as a pair in one pixel. Therefore, it is possible to easily increase the number of the phase-difference pixels 121 arranged in the pixel array section 111 and enhance the characteristics of the phase-difference pixels 121. Furthermore, the size of the phase-difference pixels 121A and 121B is changed depending on the image height depending on lens pupil correction. As a result, it is possible to increase an interchangeable lens that can cope with the image surface phase difference AF.

Note that, although the phase-difference pixels 121 are arranged in each row in the pixel array section 111 have been described above, the present technology is also applicable to the case where the phase-difference pixels 121 are arranged in each column. Also in this case, the phase-difference pixels 121A and 121B include the same size light-receiving surfaces in the center portion of the angle of view. However, the size of the light-receiving surfaces is changed depending on the image height in the peripheral portion of the angle of view. Specifically, for example, each phase-difference pixel 121 is configured to include the size of the light-receiving surface in a state in which the plurality of phase-difference pixels 121 arranged in the row shown in FIG. 4 are rotated by 90 degrees in a counterclockwise direction around the phase-difference pixel 121 in the center portion of the angle of view.

Furthermore, the present technology is not limited to application to the solid-state imaging element. That is, the present technology is applicable to general electronic apparatuses using a solid-state imaging element for an image capturing section (photoelectric conversion unit), for example, an imaging apparatus such as a digital camera, a portable terminal apparatus having an imaging function, or a copying machine using a solid-state imaging element for an image read-out section. Furthermore, the solid-state imaging element may be formed as one chip or may be in the form of a module having an imaging function in which an imaging section and a signal processing unit or an optical system are packed together.

<Configuration Example of Electronic Apparatus to Which Present Technology is Applied>

Figure 11:
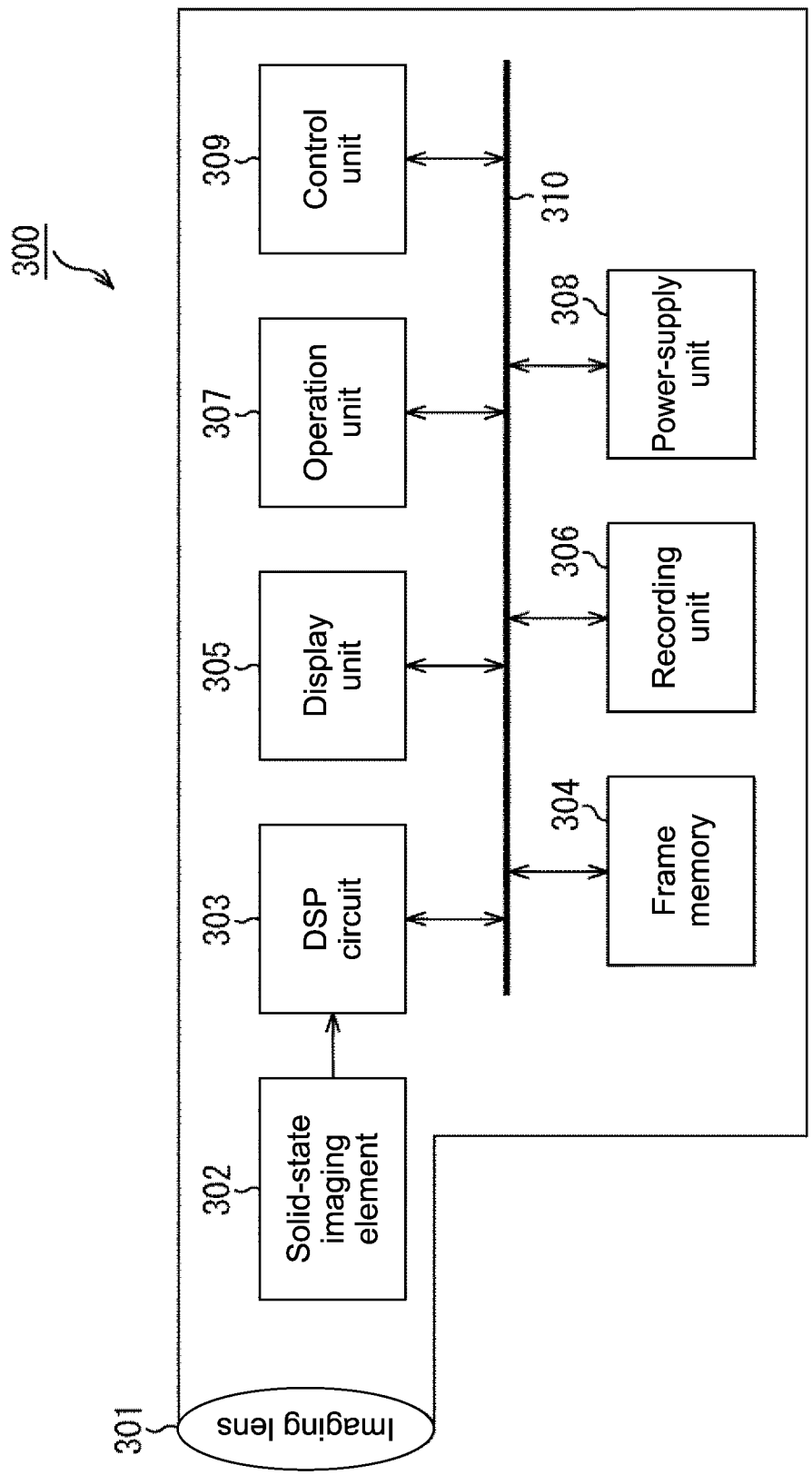
FIG. 11 A block diagram showing a configuration of an embodiment of an electronic apparatus to which the present technology is applied.

FIG. 11 is a block diagram showing a configuration of an embodiment of the electronic apparatus to which the present technology is applied.

As shown in FIG. 11, an imaging apparatus 300 serving as the electronic apparatus includes an optical unit 301 that is formed of a lens group, a solid-state imaging element 302 that adopts the configurations of the above-mentioned unit pixels 120, and a DSP (Digital Signal Processor) circuit 303 that is a camera signal processing circuit. Furthermore, the imaging apparatus 300 also includes a frame memory 304, a display unit 305, a recording unit 306, an operation unit 307, a power-supply unit 308, and a control unit 309. The DSP circuit 303, the frame memory 304, the display unit 305, the recording unit 306, the operation unit 307, the power-supply unit 308, and the control unit 309 are connected to one another via a bus line 310.

The optical unit 301 captures incident light (image light) from a subject and forms an image thereof on an imaging surface of the solid-state imaging element 302. The solid-state imaging element 302 converts the light amount of the incident light, whose image is formed on the imaging surface by the optical unit 301, into an electrical signal for each pixel and outputs color component signals for forming image signals showing the image of the subject as pixel signals. Furthermore, the solid-state imaging element 302 outputs phase difference detection signals used for image surface phase difference AF as pixel signals. As this solid-state imaging element 302, the solid-state imaging element such as the CMOS image sensor 100 according to the above-mentioned embodiment, that is, the solid-state imaging element that is capable of making the characteristics of the phase-difference pixels 121 arranged in the pixel array section 111 constant can be used.

The display unit 305 is constituted of a panel type display apparatus such as a liquid-crystal display panel and an organic EL (Electro Luminescence) panel. The display unit 305 displays a still image or moving image that is captured by the solid-state imaging element 302. The recording unit 306 records the moving image or still image captured by the solid-state imaging element 302 on a recording medium such as a flash memory.

The operation unit 307 issues operation commands relating to the various functions of the imaging apparatus 300 according to user's operations. The power-supply unit 308 appropriately supplies various powers as operation power sources to the DSP circuit 303, the frame memory 304, the display unit 305, the recording unit 306, the operation unit 307, and the control unit 309 as those supply targets.

The control unit 309 controls operations of the respective sections of the imaging apparatus 300. Furthermore, the control unit 309 calculates a defocus amount by performing predetermined calculation using the phase difference detection signal from the solid-state imaging element 302 and controls driving of imaging lens and the like of the optical unit 301 such that focusing is achieved depending on this defocus amount. With this, the image surface phase difference AF is performed and focus is achieved on the subject.

Note that, in the above-mentioned embodiment, the description has been made exemplifying the case where the present technology is applied to the CMOS image sensor in which the unit pixels that detect signal charges corresponding to the light amounts of the visible light as physical amounts are arranged in a matrix form. However, the present technology is not limited to application to the CMOS image sensor and is applicable to general solid-state imaging elements using a column system in which a column processing unit is disposed in each pixel column of a pixel array section.

Furthermore, the present technology is not limited to application to the solid-state imaging element that detects a distribution of incident light amounts of visible light and captures it as an image and is applicable to general solid-state imaging elements (physical amount distribution apparatuses) such as a solid-state imaging element that captures a distribution of incident amounts of infrared rays, X-rays, particles, or the like as an image and a fingerprint sensor that detects a distribution of other physical amounts such as a pressure and an electrostatic capacity in a broad sense and captures it as an image.

Note that embodiments of the present technology are not limited to the above-mentioned embodiments and various modifications can be made without departing from the gist of the present technology.

The present technology may also take the following configurations.

(1)

A solid-state imaging element, including:

a pixel array section in which a first pixel including a photoelectric conversion unit that receives and photoelectrically converts incident light such that a color component signal is obtained, and a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including a first region serving as a charge accumulation main part, and a second region that performs photoelectric conversion and contributes to charge transfer to the main part.

(2)

The solid-state imaging element according to (1), in which in the pair of the first photoelectric conversion unit and the second photoelectric conversion unit, the second regions on a light incident side have a size depending on pupil correction and the first regions on an opposite side of the light incident side have the same size.

(3)

The solid-state imaging element according to (2), in which impurity concentration in the first region is higher than impurity concentration in the second region.

(4)

The solid-state imaging element according to (3), in which the second region is larger than the first region.

(5)

The solid-state imaging element according to (1), further including:

a first transfer transistor that transfers charges accumulated in the first photoelectric conversion unit, and a second transfer transistor that transfers charges accumulated in the second photoelectric conversion unit, in which in the pair of the first photoelectric conversion unit and the second photoelectric conversion unit, impurity concentration in a region near the first transfer transistor and a region near the second transfer transistor is higher than impurity concentration in other regions.

(6)

The solid-state imaging element according to (5), in which the first transfer transistor is disposed near a position closest to a center of the light-receiving surface of the first photoelectric conversion unit, and the second transfer transistor is disposed near a position closest to a center of the light-receiving surface of the second photoelectric conversion unit.

(7)

The solid-state imaging element according to (6), further including:

a first floating diffusion region held for reading out a charge transferred from the first photoelectric conversion unit by the first transfer transistor, as a signal; and a second floating diffusion region held for reading out a charge transferred from the second photoelectric conversion unit by the second transfer transistor, as a signal.

(8)

The solid-state imaging element according to any one of (1) to (7), in which exposure and transfer in the first photoelectric conversion unit and the second photoelectric conversion unit are performed at the same time.

(9)

The solid-state imaging element according to any one of (1) to (8), in which the pair of the first photoelectric conversion unit and the second photoelectric conversion unit includes a separation section therebetween that is continuously changed.

(10)

The solid-state imaging element according to any one of (1) to (9), in which the pair of the first photoelectric conversion unit and the second photoelectric conversion unit is separated by metal, an oxide film, or impurities.

(11)

A driving method for a solid-state imaging element, including a pixel array section in which a first pixel including a photoelectric conversion unit that receives and photoelectrically converts incident light such that a color component signal is obtained, and a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including a first region serving as a charge accumulation main part, and a second region that performs photoelectric conversion and contributes to charge transfer to the main part, the method including:

a step of separately driving, by the pixel driving unit, the pair of the first photoelectric conversion unit and the second photoelectric conversion unit to perform exposure and transfer in the first photoelectric conversion unit and the second photoelectric conversion unit at the same time.

(12)
An electronic apparatus, including:
a solid-state imaging element, including
a pixel array section in which
a first pixel including a photoelectric conversion unit that receives and photoelectrically converts incident light such that a color component signal is obtained, and
a second pixel including a pair of a first photoelectric conversion unit and a second photoelectric conversion unit including light-receiving surfaces having a size depending on an image height such that a phase difference detection signal is obtained are arranged in a matrix form, the pair of the first photoelectric conversion unit and the second photoelectric conversion unit each including
a first region serving as a charge accumulation main part, and
a second region that performs photoelectric conversion and contributes to charge transfer to the main part; and
a control unit that controls image surface phase difference AF (Autofocus) using the phase difference detection signal output from the solid-state imaging element.

DESCRIPTION OF SYMBOLS

100 CMOS image sensor
111 pixel array section
120 normal pixel
121, 121A, 121B phase-difference pixel
151, 152 element separation portion
300 imaging apparatus
302 solid-state imaging element
309 control unit
R1 first region
R2 second region
PD, PD1, PD2 photodiode
TR, TR1, TR2 transfer transistor
RST, RST1, RST2 reset transistor
AMP, AMP1, AMP2 amplification reset transistor
SEL, SEL1, SEL2 selection transistor
FDG, FDG1, FDG2 capacitance-switching transistor

What is claimed is:

1. A solid-state imaging element, comprising:
a pixel array section including a first unit pixel arranged at a center portion of the pixel array section and a second unit pixel arranged at a peripheral portion of the pixel array section, each of the first unit pixel and the second unit pixel including:
a first pixel including a photoelectric conversion unit that receives and photoelectrically converts incident light such that a color component signal is obtained; and
a second pixel including a pair of a first photoelectric conversion unit and a second photoelectric conversion unit including light-receiving surfaces having a size depending on an image height such that a phase difference detection signal is obtained, the pair of the first photoelectric conversion unit and the second photoelectric conversion unit each including:
a first region serving as a charge accumulation main part; and
a second region that performs photoelectric conversion and contributes to charge transfer to the charge accumulation main part,
wherein the light receiving surfaces of the first photoelectric conversion unit and the second photoelectric conversion unit in the first unit pixel are a same size, and
wherein the light receiving surfaces of the first photoelectric conversion unit and the second photoelectric conversion unit in the second unit pixel are different sizes.

2. The solid-state imaging element according to claim 1, wherein
in the pair of the first photoelectric conversion unit and the second photoelectric conversion unit, the second regions on a light incident side have a size depending on pupil correction and the first regions on an opposite side of the light incident side have the same size.

3. The solid-state imaging element according to claim 2, wherein
impurity concentration in the first region is higher than impurity concentration in the second region.

4. The solid-state imaging element according to claim 3, wherein
the second region is larger than the first region.

5. The solid-state imaging element according to claim 1, further comprising:
a first transfer transistor that transfers charges accumulated in the first photoelectric conversion unit, and
a second transfer transistor that transfers charges accumulated in the second photoelectric conversion unit,
wherein in the pair of the first photoelectric conversion unit and the second photoelectric conversion unit, impurity concentration in a region near the first transfer transistor and a region near the second transfer transistor is higher than impurity concentration in other regions.

6. The solid-state imaging element according to claim 5, wherein
the first transfer transistor is disposed near a position closest to a center of the light-receiving surface of the first photoelectric conversion unit, and
the second transfer transistor is disposed near a position closest to a center of the light-receiving surface of the second photoelectric conversion unit.

7. The solid-state imaging element according to claim 6, further comprising:
a first floating diffusion region for reading out a charge transferred from the first photoelectric conversion unit by the first transfer transistor, as a signal; and
a second floating diffusion region for reading out a charge transferred from the second photoelectric conversion unit by the second transfer transistor, as a signal.

8. The solid-state imaging element according to claim 7, wherein
exposure and transfer in the first photoelectric conversion unit and the second photoelectric conversion unit are performed at the same time.

9. The solid-state imaging element according to claim 1, wherein
the pair of the first photoelectric conversion unit and the second photoelectric conversion unit includes a separation section therebetween that is continuously changed.

10. The solid-state imaging element according to claim 9, wherein
the separation section includes metal, an oxide film, or impurities.

11. The solid-state imaging element according to claim 1, wherein first photoelectric conversion unit and the second photoelectric conversion unit are adjacent to one another in a row direction of the pixel array section.

12. The solid-state imaging element according to claim 11, wherein if the second unit pixel is to the right of the first unit pixel, the light receiving surface of the first photoelectric conversion unit is larger than the light receiving surface of the second photoelectric conversion unit.

13. The solid-state imaging element according to claim 12, wherein if the second unit pixel is to the left of the first unit pixel, the light receiving surface of the first photoelectric conversion unit is smaller than the light receiving surface of the second photoelectric conversion unit.

14. A driving method for a solid-state imaging element, including:
   a pixel array section including a first unit pixel arranged at a center portion of the pixel array section and a second unit pixel arranged at a peripheral portion of the pixel array section, each of the first unit pixel and the second unit pixel including:
      a first pixel including a photoelectric conversion unit that receives and photoelectrically converts incident light such that a color component signal is obtained; and
      a second pixel including a pair of a first photoelectric conversion unit and a second photoelectric conversion unit including light-receiving surfaces having a size depending on an image height such that a phase difference detection signal is obtained, the pair of the first photoelectric conversion unit and the second photoelectric conversion unit each including:
         a first region serving as a charge accumulation main part; and
         a second region that performs photoelectric conversion and contributes to charge transfer to the charge accumulation main part,
      wherein the light receiving surfaces of the first photoelectric conversion unit and the second photoelectric conversion unit in the first unit pixel are a same size, and
      wherein the light receiving surfaces of the first photoelectric conversion unit and the second photoelectric conversion unit in the second unit pixel are different sizes, the method comprising:
         separately driving, by a pixel driving unit, the pair of the first photoelectric conversion unit and the second photoelectric conversion unit in each of the first unit pixel and the second unit pixel to perform exposure and transfer in the first photoelectric conversion unit and the second photoelectric conversion unit at the same time for each of the first unit pixel and the second unit pixel.

15. An electronic apparatus, comprising:
   a solid-state imaging element, including:
      a pixel array section including a first unit pixel arranged at a center portion of the pixel array section and a second unit pixel arranged at a peripheral portion of the pixel array section, each of the first unit pixel and the second unit pixel including:
         a first pixel including a photoelectric conversion unit that receives and photoelectrically converts incident light such that a color component signal is obtained; and
         a second pixel including a pair of a first photoelectric conversion unit and a second photoelectric conversion unit including light-receiving surfaces having a size depending on an image height such that a phase difference detection signal is obtained, the pair of the first photoelectric conversion unit and the second photoelectric conversion unit each including:
            a first region serving as a charge accumulation main part; and
            a second region that performs photoelectric conversion and contributes to charge transfer to the charge accumulation main part,
         wherein the light receiving surfaces of the first photoelectric conversion unit and the second photoelectric conversion unit in the first unit pixel are a same size, and
         wherein the light receiving surfaces of the first photoelectric conversion unit and the second photoelectric conversion unit in the second unit pixel are different sizes; and
   a controller that controls image surface phase difference AF (Autofocus) using the phase difference detection signal output from the solid-state imaging element.

* * * * *